(12) United States Patent
Arik et al.

(10) Patent No.: US 7,140,420 B2
(45) Date of Patent: Nov. 28, 2006

(54) THERMAL MANAGEMENT APPARATUS AND USES THEREOF

(75) Inventors: Mehmet Arik, Niskayuna, NY (US);
Kenneth William Rohling, Niskayuna, NY (US); Ronald Dean Watkins, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 237 days.

(21) Appl. No.: 10/702,386

(22) Filed: Nov. 5, 2003

(65) Prior Publication Data
US 2005/0093543 A1     May 5, 2005

(51) Int. Cl.
*F28F 7/00* (2006.01)
*H01F 27/08* (2006.01)

(52) U.S. Cl. .................. 165/80.2; 165/80.3; 165/80.4; 324/318; 336/62; 336/61

(58) Field of Classification Search ............... 165/80.2, 165/80.3, 80.4, 80.5, 104.33, 185, 168, 171, 165/53, 56; 324/318; 336/55, 61, 62
See application file for complete search history.

(56) References Cited

U.S. PATENT DOCUMENTS

| | | | |
|---|---|---|---|
| 4,023,557 A * | 5/1977 | Thorne et al. ............... 165/171 |
| 4,155,402 A * | 5/1979 | Just ........................ 165/104.33 |
| 4,161,212 A * | 7/1979 | Hightower ................... 165/171 |
| 4,257,481 A * | 3/1981 | Dobson ....................... 165/168 |
| 4,332,080 A * | 6/1982 | Bleckmann ................. 165/171 |
| 4,617,807 A * | 10/1986 | Pritchett et al. .............. 62/399 |
| 4,646,814 A * | 3/1987 | Fennesz ........................ 165/56 |
| 5,285,347 A * | 2/1994 | Fox et al. .................. 165/80.3 |
| 5,489,848 A * | 2/1996 | Furukawa .................... 324/318 |
| 5,886,548 A * | 3/1999 | Doty et al. .................. 324/318 |
| 5,920,457 A * | 7/1999 | Lamb et al. ........... 165/104.33 |
| 6,008,648 A | 12/1999 | Linz et al. |
| 6,011,394 A * | 1/2000 | Petropoulos et al. ....... 324/318 |
| 6,031,751 A * | 2/2000 | Janko ..................... 165/104.33 |
| 6,073,684 A * | 6/2000 | Fiechter et al. ........ 165/104.33 |
| 6,111,412 A | 8/2000 | Boemmel et al. |
| 6,236,207 B1 * | 5/2001 | Arz et al. .................... 324/318 |
| 6,525,537 B1 | 2/2003 | Nerreter |
| 6,525,634 B1 | 2/2003 | Laskaris et al. |
| 6,552,545 B1 * | 4/2003 | Kaindl et al. ............... 324/318 |
| 6,622,494 B1 | 9/2003 | Pourrahimi |
| 6,636,041 B1 | 10/2003 | Arz et al. |
| 6,640,647 B1 | 11/2003 | Hong et al. |
| 6,642,717 B1 * | 11/2003 | Dietz et al. ................. 324/318 |
| 6,781,376 B1 * | 8/2004 | Schaaf ....................... 324/318 |

(Continued)

FOREIGN PATENT DOCUMENTS

DE        19722211 A1 *   8/1998

(Continued)

OTHER PUBLICATIONS

Mark Wippich and Kathy Li Dessau, "Tunable Lasers and Fiber-Bragg-Grating Sensors," *The Industrial Physicist*, pp. 24-27 (Jun./Jul. 2003).

(Continued)

*Primary Examiner*—Ljiljana Ciric
(74) *Attorney, Agent, or Firm*—Fletcher Yoder

(57) ABSTRACT

In one aspect, the present invention is a cooling assembly for an electrical component. The assembly includes a non-magnetic, thermally conducting spreader substrate, and at least one serpentine cooling tube disposed on and in thermal contact with the thermally conducting spreader substrate so that said substrate is cooled when the one or more serpentine cooling tubes are operating.

24 Claims, 7 Drawing Sheets

U.S. PATENT DOCUMENTS

2001/0033168 A1    10/2001    Heid
2005/0168222 A1*    8/2005    Arz et al. .................. 324/318

FOREIGN PATENT DOCUMENTS

WO      WO 03/093853 A1    11/2003

OTHER PUBLICATIONS

A. Fernandez Fernandez, H. Ottevaere, C. Van Ierschot, K. Panajatov, F. Berghmans and H. Thienpont, "Multi-parameter Force Sensing with Fiber Bragg Grating Sensors," Proceedings Symposium IEEE/LEOS, Benelux Chapter, Amsterdam (2002).

Xiao Chun Li, Fritz Prinz and John Seim, "Thermal Behavior of a Metal Embedded Fiber Bragg Grating Sensor," *Institute of Physics Publishing*, Smart Materials and Structures 10, pp. 575-579 (2001).

Jaehoon Jung, Hui Nam, Byoungho Lee, Jae Oh Byun and Nam Seong Kim, "Fiber Bragg Grating Temperature Sensor with Controllable Sensitivity," *Applied Optics*, vol. 38, No. 13, pp. 2752-2754 (May 1, 1999).

Sung Chul Kang, Se Yoon Kim, Sang Bae Lee, Seo Won Kwon, Sang Sam Choi and Byoungho Lee, "Temperature-Independent Strain Sensor System Using a Tilted Fiber Brag Grating Demodulator," *IEEE Photonics Technology Letters*, vol. 10, No. 10, pp. 1461-1463 (Oct. 1998).

Rogerio M. Cazo, Carmen L. Barbosa, Haroldo T. Hattori, Renato C. Rabelo, Osni Lisboa and Jorge L.S. Ferreira, "Fiber Brag Grating Temperature Sensor," *Optics (Optic Guides and Staple Fibres)*, Coordinator: Carlos Monken, Location Unknown, (May 17, 2001).

\* cited by examiner

THERMAL MANAGEMENT APPARATUS AND USES THEREOF

BACKGROUND OF THE INVENTION

This invention relates generally to apparatus for thermal management of heat-generating electrical components and devices using such apparatus, including but not limited to thermally managed gradient coils in magnetic resonance imaging (MRI) systems, and MRI systems using such thermally managed electrical components.

A highly uniform magnetic field is useful for using magnetic resonance image (MRI) and nuclear magnetic resonance (NMR) systems as a medical device or a chemical/biological device. Popular and low maintenance cost MRI systems currently available use a permanent magnet system that creates a middle to high range uniform field in a pre-determined space (imaging volume). A permanent magnet system usually uses multiple permanent magnet blocks such as NdFeB to form a single magnetic object and to achieve a desired high uniform magnetic field in the imaging volume. In other known systems, an electromagnetic coil (such as a superconducting coil) is used to generate a high uniform magnetic field. In some systems, the magnetic field generated by such a coil can be as high as 7 Tesla, or even higher in some cases.

In known MRI systems, gradient coils are used to vary the strength of the magnetic field in particular locations of the imaging volume by introducing a constant gradient in the primary magnetic field. Varying magnetic field makes it possible to determine the location in a sample from which a signal is coming. In this manner, particular regions of a sample may be selected for analysis.

Thermal management of MRI gradient coils has a significant effect on image quality and reliability. In some known configurations, gradient coils consist of many thin layers that include copper coils, wires, epoxy, tape, and thermally conductive epoxy. Each layer thus has a thermal resistance that depends upon its thickness, surface area, and thermal conductivity.

Known MRI thermal management systems utilize cooling tubes at various locations. However, axial cooling systems (i.e., cooling tubes placed along a z-axis, nominally parallel to a head-to-toe patient axis), for example, are generally limited to covering only 15% to 25% of the volume of the MRI system due to bending limitations of the cooling tubes. This coverage is very similar to the coverage provided by serpentine structures in many heat exchangers. The limited volume coverage of axial cooling systems results in heat spreading resistance. Nevertheless, axial cooling systems provide an amount of thermal management without affecting the magnetic field and image quality with a distance of from 20 to 40 mm between hollow cooling tubes. However a temperature gradient can exist between cooling tubes placed in the same radius due to localized heat generation within gradient coils and low thermal conductivity of intermediate layers within the gradient coils.

BRIEF DESCRIPTION OF THE INVENTION

The present invention therefore provides, in some configurations, a cooling assembly for an electrical component. The assembly includes a non-magnetic, thermally conducting spreader substrate, and at least one serpentine cooling tube disposed on and in thermal contact with the thermally conducting spreader substrate so that said substrate is cooled when the one or more serpentine cooling tubes are operating.

In some configurations, the present invention provides an electrical component that includes a non-magnetic spreader substrate having thermally conducting surfaces. The electrical component also includes at least one serpentine cooling tube disposed on and in thermal contact with at least one of the thermally conducting surfaces so that the contacted surface is cooled when the serpentine cooling tube is operating. In addition, the electrical component includes a cylindrical magnetic winding layer. The magnetic winding layer is in thermal contact with the non-magnetic spreader substrate so as to conduct heat from the winding layer to the non-magnetic spreader substrate. The non-magnetic spreader substrate includes a metal layer bonded to a thermally conducting, electrically nonconducting layer. The metal layer is in thermal contact with one or more serpentine cooling tubes, and the winding layer is in contact with the thermally conducting, electrically nonconducting layer.

In some configurations, the present invention provides a magnetic resonance imaging (MRI) device having a main magnet. The MRI device also includes a non-magnetic spreader substrate having thermally conducting surfaces, and at least one serpentine cooling tube disposed on and in thermal contact with the thermally conducting surface so that the contacted surface is cooled when the serpentine cooling tube or tubes are operating. The MRI device further includes a gradient coil having a cylindrical magnetic winding layer. The magnetic winding layer is in thermal contact with the non-magnetic spreader substrate so as to conduct heat from the winding layer to the non-magnetic spreader substrate. The non-magnetic spreader substrate includes a metal layer bonded to a thermally conducting, electrically nonconducting layer. The metal layer is in thermal contact with the serpentine cooling tube or tubes. The winding layer is in contact with the thermally conducting, electrically nonconducting layer.

It will be appreciated that many configurations of the present invention reduce localized hot spots in electrical components. Many configurations of the present invention also provide lower temperatures and more even temperature distributions in coils than conventional cooling techniques. As a result, more efficient thermal management is achieved.

BRIEF DESCRIPTION OF THE DRAWINGS

FIGS. 6 and 7 are cut-away views of the configuration of FIG. 1 along line 1—1, wherein FIG. 6 illustrates the cylindrical winding layer being outside the cylindrical spreader substrate, and FIG. 7 illustrates a second cylindrical magnetic winding layer being disposed over the filler layer and separated from a broken metal layer of the annular fin by an annular layer of insulation. The various FIGS. 1–7 are not necessarily drawn to scale.

DETAILED DESCRIPTION OF THE INVENTION

Figure 1:
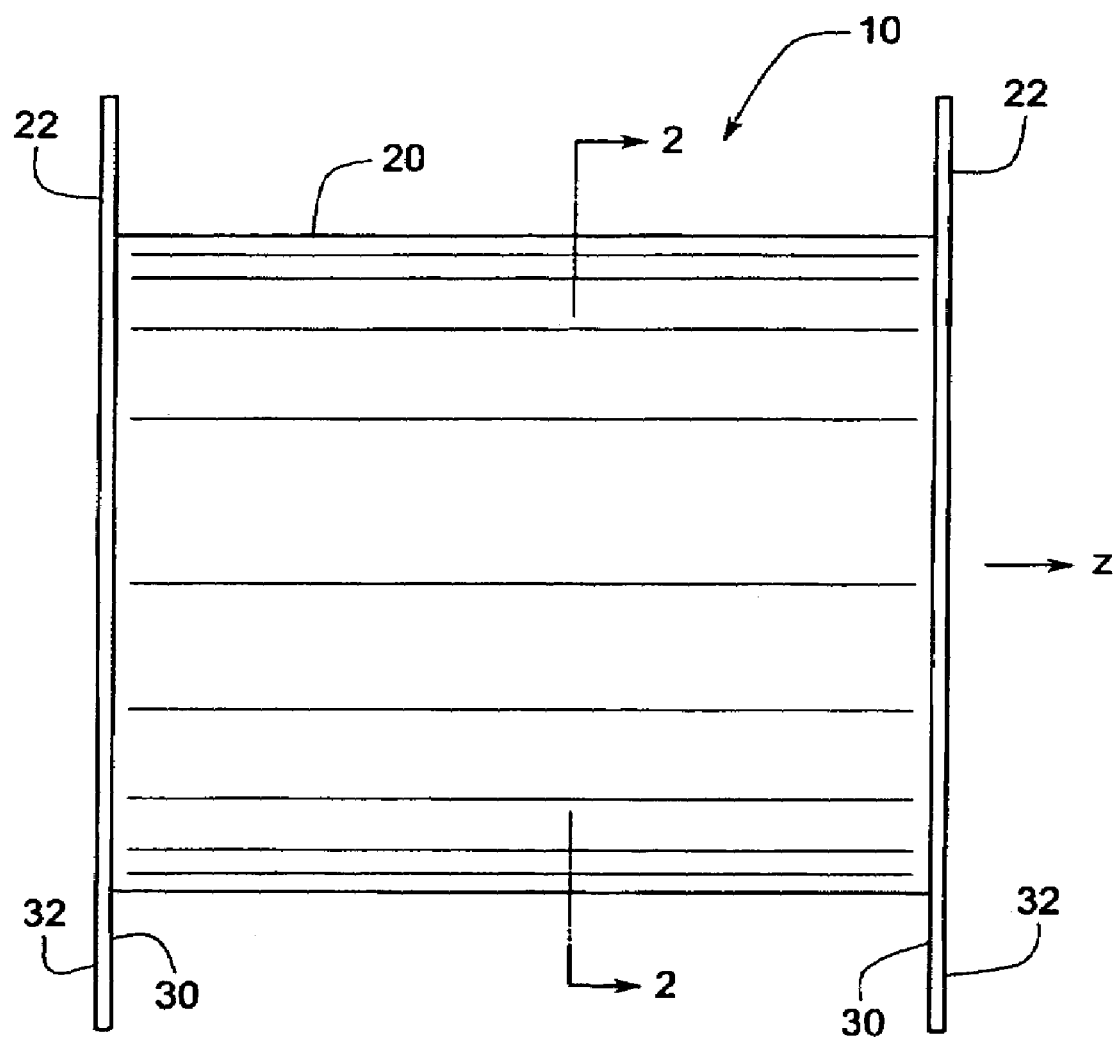
FIG. 1 is a side view representative of various configurations of electrical components of the present invention.
Figure 2:
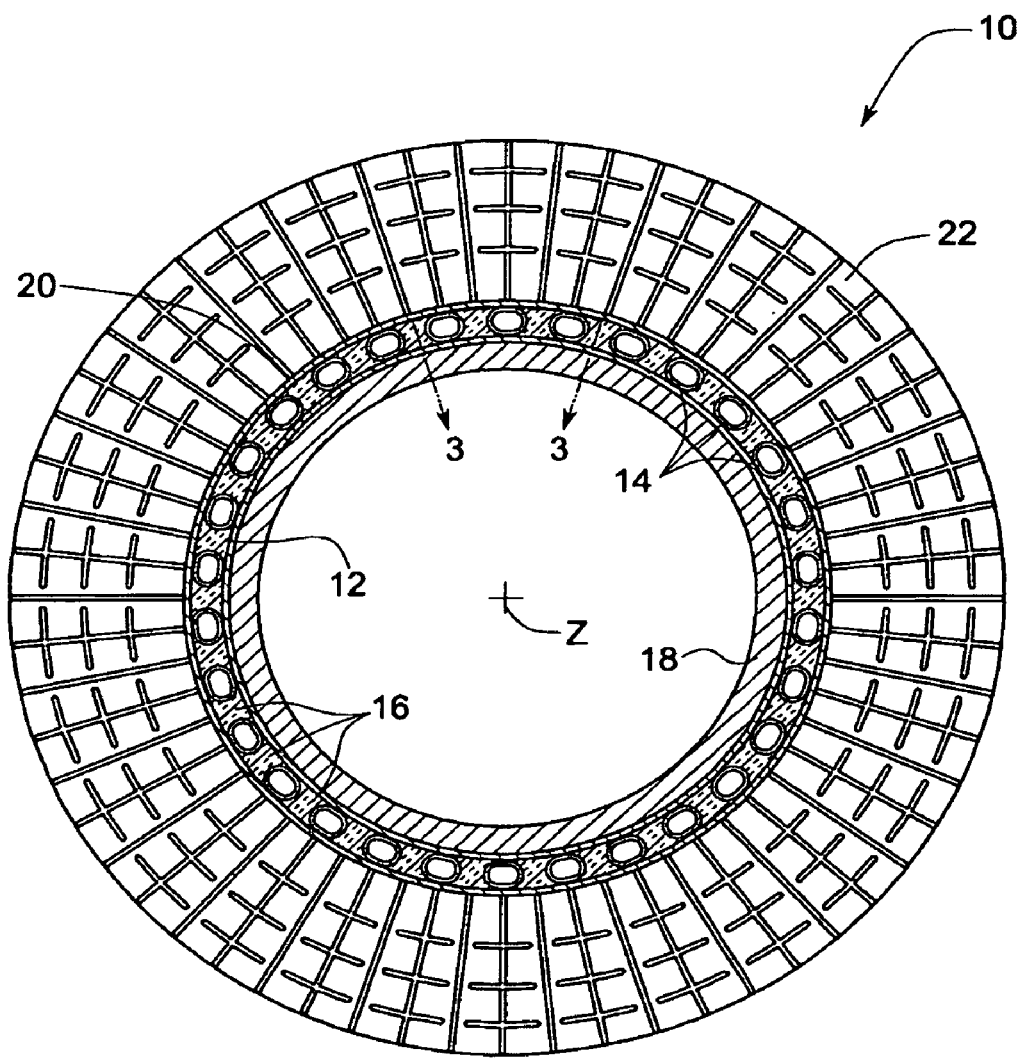
FIG. 2 is a cut-away view of the configuration of FIG. 1 along line 1—1.

In some configurations of the present invention and referring to FIGS. 1 and 2, an electrical component 10 includes a thermally conductive, non-magnetic spreader substrate 12. At least one serpentine cooling tube 14 is disposed on and is in thermal contact with at least one of the thermally conductive surfaces of substrate 12, for example, the outside surface of substrate 12.

In some configurations, cooling tubes 14 have coolant running through them and exchange heat with a remote heat exchanger. Suitable coolants include, but are not limited to, water, water and glycol mixtures, refrigerant, or dielectric fluids such as FC-72 or HFE7100. When cooling tube 14 is operating, the outside surface of substrate 12 is cooled. A thermally-conducting filler 16 is applied in some configurations between curves of cooling tube 14. A cylindrical magnetic winding layer 18 is in thermal contact with the inside surface of substrate 12, which conducts heat from winding layer 18 to non-magnetic spreader substrate 12. Winding layer 18, when energized, provides the magnetic field for gradient coil 10. In some configurations, to avoid eddy currents, cooling tubes 14 are arranged so the they do not form closed electrically conductive loops that couple with a magnetic field of winding layer 18. For example, in some configurations, cooling tubes 14 comprise non-conductive couplings (e.g., plastic, ceramic, or other non-conductive couplings, not shown in the Figures) at intervals joining metallic segments of tubes 14. Also, in some configurations, cooling tubes 14 are fitted to a source of non-conductive coolant (e.g., water) using a non-conductive coupling. Also in some configurations, cooling tubes 14 are arranged so as to avoid multiturn spirals, to reduce induced voltages due to coupling with the gradient winding.

In some configurations, an additional insulating layer 20 is provided over cooling tubes 14 and filler 16. Insulating layer 20 can comprise an excess amount of filler 16. In some configurations, one or more thermally conducting cooling annular fins 22 in thermal contact with substrate 12 are also provided. The Figures are not drawn to scale, and in some configurations, fins 22 are thinner than illustrated in the Figures.

In configurations in which electrical component 10 is a gradient coil of an MRI system, cylindrical magnetic winding layer 18 may comprise wires wound cylindrically around the z-axis or wound end-to-end parallel to the z-axis. Other winding modes are also possible. Magnetic winding layer 18 may further comprise various filler material, including thermally conductive filler material, insulating tape, epoxy, etc.

Figure 3:
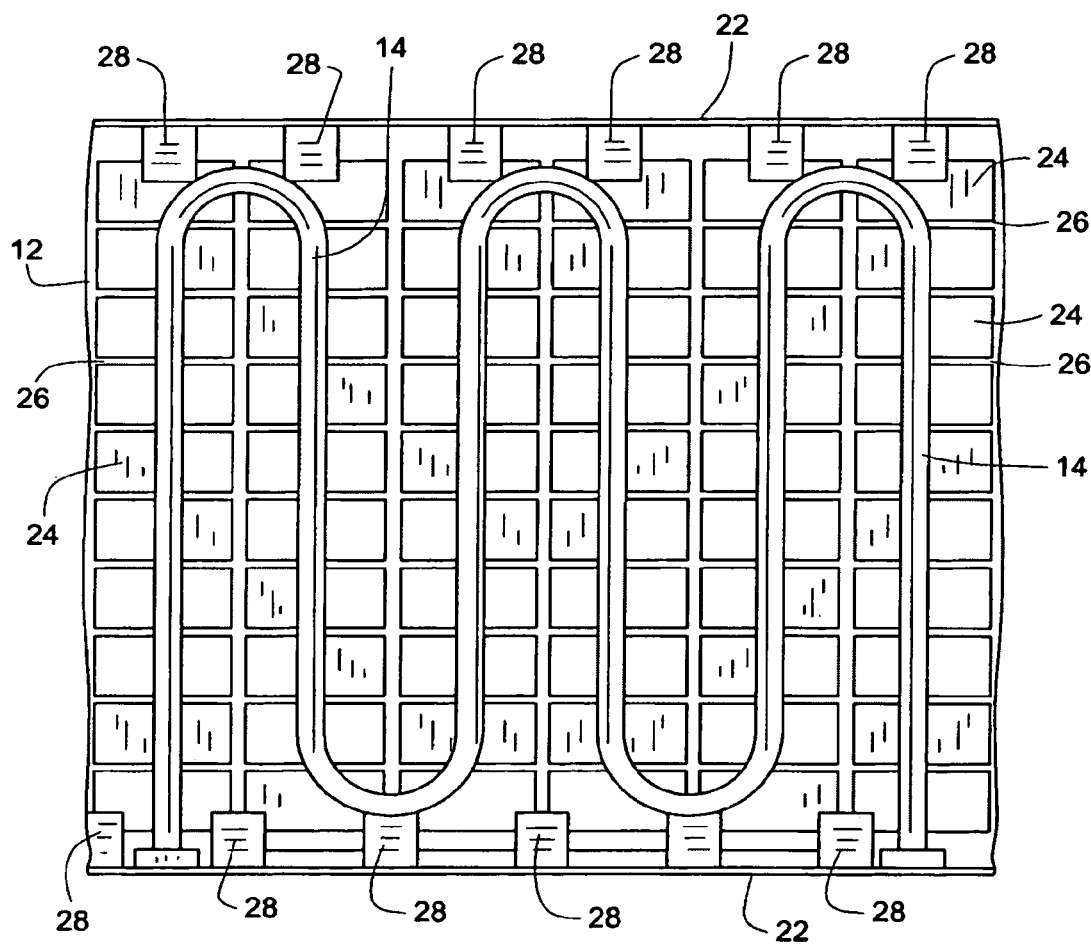
FIG. 3 is a flattened representation of a portion 3—3 of the non-magnetic spreader substrate and serpentine coils of FIG. 1.

FIG. 3 represents a portion of thermally conductive layer 12 and serpentine tubes 14 as viewed from outside component 10 as indicated by lines 3—3 in FIG. 2. For clarity, filler material 16 is not shown in FIG. 3. Referring to FIG. 2 and FIG. 3, A non-magnetic spreader substrate 12 comprises a metal layer 24 bonded to a Thermally Conducting, Electrically Nonconducting (TCEN) layer 26. Metal layer 24 is in thermal contact with at least one serpentine cooling tube 14. Winding layer 18 is in thermal contact with TCEN layer 26. Spreader substrate 12 is cooled when serpentine cooling tube 14 is operating. In some configurations, and as illustrated in FIG. 3, metal layer 24 is broken into segments to prevent significant eddy currents from being induced therein. In some configurations, a pattern is etched in metal layer 24, whereby gaps in metal layer 24 expose portions of TCEN layer 26.

In some configurations of the present invention, metal layer 24 is copper or an alloy thereof, or aluminum or an alloy thereof, and TCEN layer 26 is a thermally-conductive epoxy or other suitable non-magnetic material. Serpentine cooling tubes 14 is disposed on and is welded, brazed, or soldered to metal layer 24. In some configurations, serpentine tubes 14 are glued to metal layer 24 utilizing a thermally conductive glue.

Figure 4:
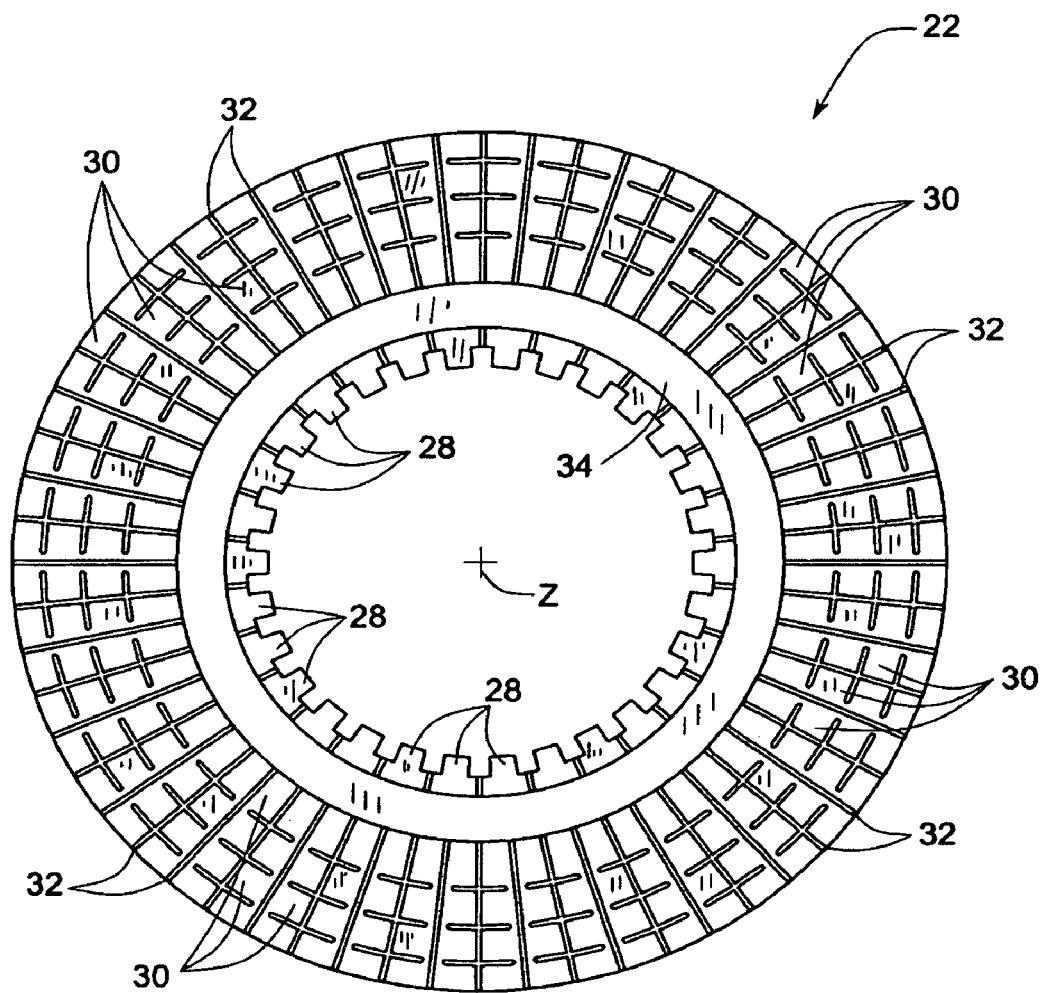
FIG. 4 is a representation of an inner-facing surface of a fin suitable for use in configurations of electrical components represented in FIG. 1.

Some configurations of the present invention further comprise a thermally conducting annular fin 22 affixed to and thermally conductive to spreader substrate 12. More particularly, in some configurations and referring to FIG. 2, FIG. 3, and FIG. 4, metal tabs 28 of conducting fin 22 are bonded to metal layer 24 of spreader substrate 12. For example, metal tabs 28 shown in FIG. 4 can be bent perpendicularly to contact metal layer 24 of spreader substrate 12 and welded, soldered, or brazed thereon, or glued using a thermally conductive epoxy. In cylindrical configurations of apparatus 10, fin 22 is annular, and may be attached in a plane perpendicular to the z-axis of cylindrical substrate 12. Fin 22 can comprise a broken metal layer 30 bonded to a TCEN layer 32, which may be a thermally conductive epoxy layer. For example, broken metal layer 30 may comprise a layer of copper or aluminum etched into islands with gaps in the metal through which TCEN layer 32 is visible, as shown in FIG. 4. TCEN layer 32 is directed outwardly from the cylindrical spreader substrate in some configurations, as shown in FIG. 1, thereby advantageously presenting a non-conductive outer layer when used, for example, in an MRI system.

In some configurations of the present invention and referring to FIG. 4, all or a portion of inwardly directed metal layer 30 is covered by an annular insulating layer 34, such as an insulating adhesive tape or plastic electrical tape. Tape 34 can be used to separate an additional cylindrical magnetic winding (not shown in the figures) wound over insulating layer 20 from broken metal layer 30.

The Figures are representative of configurations of the present invention having one or more serpentine cooling tubes 14 outside cylindrical spreader substrate 12. However, in various configurations of the present invention, serpentine cooling tubes 14 are disposed inside cylindrical substrate 12 and winding layer 18 is disposed outside cylindrical spreader substrate 12.

Figure 5:
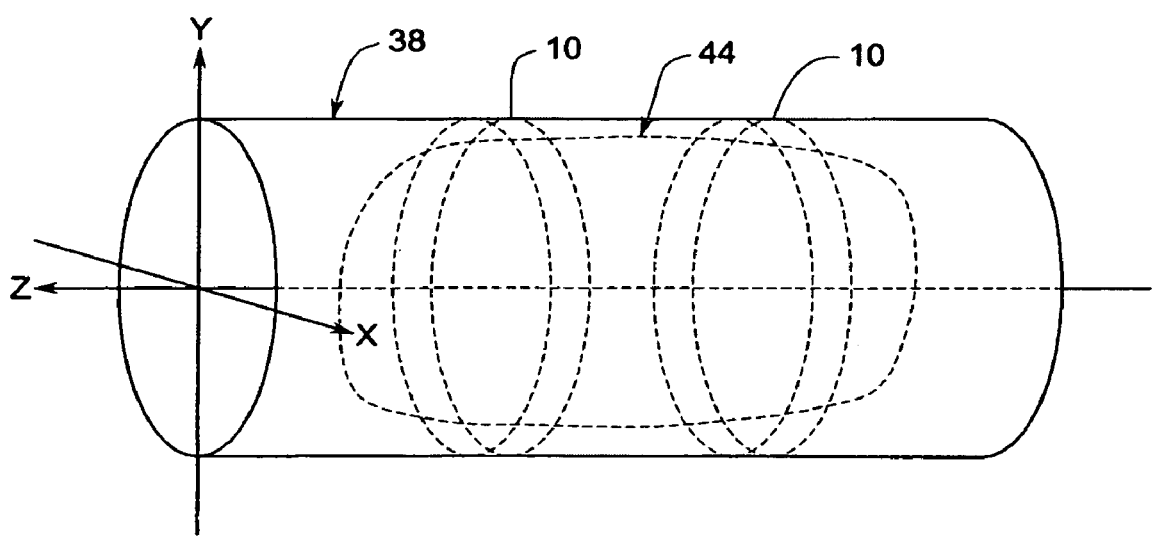
FIG. 5 is a drawing representative of a main magnet and gradient coils of various configurations of magnetic resonance imaging systems of the present invention.

In some configurations and referring to FIG. 2, FIG. 3, and additionally to FIG. 5, a magnetic resonance imaging (MRI) device comprises a main magnet winding or windings 38 configured to image a volume of interest 44 (shown with dashed lines) inside winding 38. The MRI device also includes one or more configurations of thermally cooled electrical components 10 of the present invention (shown with dashed lines) inside winding 38. For example, thermally cooled electrical components 10 each comprise at least one serpentine cooling tube 14 (not shown in FIG. 5, but shown in FIGS. 2 and 3). Electrical components 10, and hence, MRI device 36, each further comprise a gradient coil comprising a cylindrical magnetic winding layer 18. Serpentine cooling tube 14 is disposed on and in thermal contact with the thermally conductive surface of substrate 12 so that the contacted surface is cooled when serpentine cooling tube 14 is operating. The gradient coil comprising winding layer 18 is in thermal contact with non-magnetic spreader substrate 12 so as to conduct heat from winding layer 18 to substrate layer 12. Substrate 12 includes metal layer 24 and bonded to a thermally conducting electrically non-conducting layer 26. Cooling tubes 14 are in thermal contact with metal layer 24 and winding layer 18 is in contact with electrically non-conducting layer 26.

Figure 6:
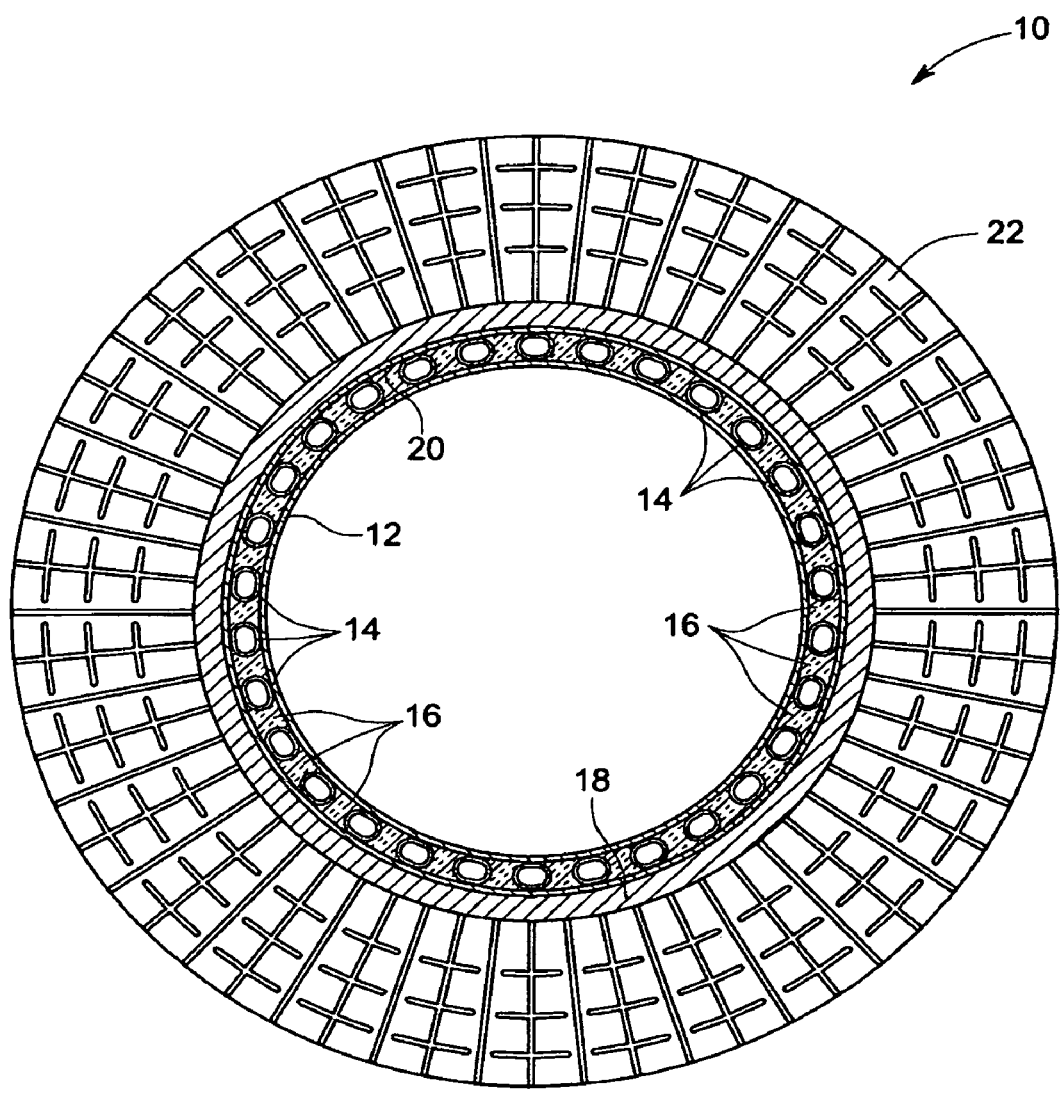
Figure 7:
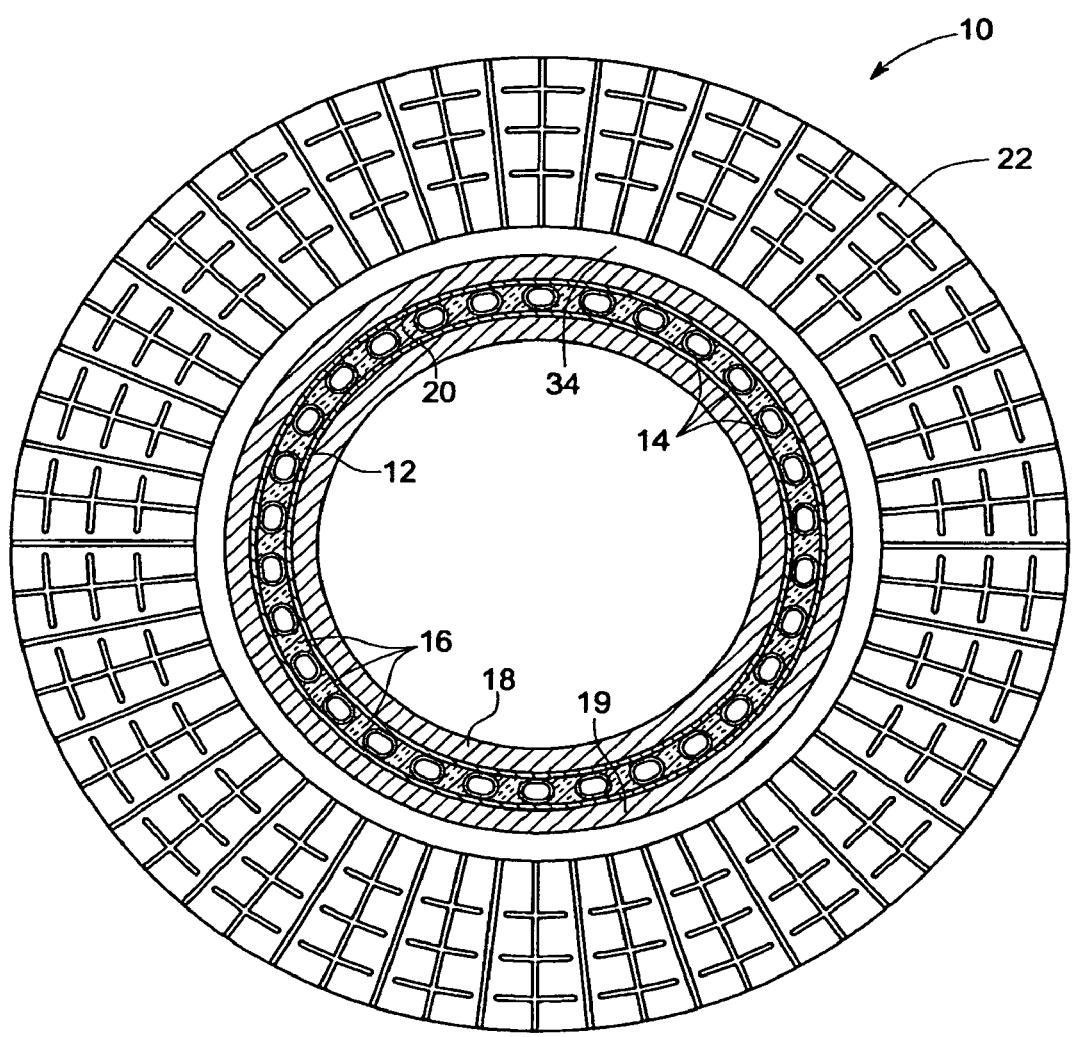

In some configurations of MRI device 36, substrate 12 is cylindrical, serpentine cooling tube or tubes 14 are inside cylindrical substrate 12, and winding layer 18 is outside substrate 12 as shown in FIG. 6. In various other configurations, spreader substrate 12 is cylindrical, serpentine cooling tube or tubes 14 are outside cylindrical substrate 12, and winding layer 18 is inside substrate 12. Some configurations of MRI device 36 also include annular fin 22. Fin 22 is affixed to and thermally conductive to spreader substrate 12, and comprises a broken metal layer 30 bonded to a thermally conducting, electrically non-conducting layer 32, the latter advantageously facing outwardly to provide an electrically non-conducting outside face. An annular layer of insulation 34 is disposed over the broken metal layer of annular fin 22 in some configurations to electrically insulate a second winding (as shown in FIG. 7) wound over a filler layer 20.

In some configurations of the present invention, a cooling assembly for an electrical component comprises a flat rather than cylindrical spreader substrate 12. Such cooling assemblies are also useful in some configurations of MRI apparatus.

The present invention should not be construed as excluding configurations in which one or more cooling tubes are provided that contact both surfaces. For example, a cooling tube 14 may fold around an edge of substrate 12 or penetrate through a hole in substrate 12. Nor does the present invention exclude configurations in which separate cooling tubes are provided for each surface of substrate 12, or in which substrate 12 comprises a plurality of smaller, conjoined substrates. For example, a cylindrical tube may be approximated using a tube having planar surfaces and a polygonal cross-section. A cooling tube 14 may contact several of the planar surfaces of such a substrate.

Additional high thermal conductivity polymer materials can advantageously be disposed between cooling layers or between bends of serpentine cooling tube or tubes 14 in some configurations of the present invention.

It will be recognized that many configurations of the present invention reduce localized hot spots in electrical components. Many configurations of the present invention also provide lower temperatures and more even temperature distributions in coils than conventional cooling techniques. As a result, more efficient thermal management is achieved.

While the invention has been described in terms of various specific embodiments, those skilled in the art will recognize that the invention can be practiced with modification within the spirit and scope of the claims.

What is claimed is:

1. A cooling assembly for an electrical component, said assembly comprising:
    a non-magnetic, thermally conducting spreader substrate;
    at least one serpentine cooling tube disposed on and in thermal contact with said thermally conducting spreader substrate so that said substrate is cooled when said at least one serpentine cooling tube is operating;
    said spreader substrate comprising a broken metal layer bonded to a thermally conducting, electrically non-conducting layer, said metal layer being in thermal contact with said at least one serpentine cooling tube, and said at least one serpentine cooling tube being disposed on said broken metal layer.

2. An assembly in accordance with claim 1 wherein said spreader substrate comprises a metal layer bonded to a thermally conducting, electrically nonconducting layer, and said metal layer is in thermal contact with said at least one serpentine cooling tube.

3. An assembly in accordance with claim 2 wherein said serpentine cooling tube is glued to said spreader substrate utilizing a thermally conductive glue.

4. An assembly in accordance with claim 2 wherein said metal layer is broken to prevent eddy currents in said metal layer.

5. An assembly in accordance with claim 4 wherein said metal comprises copper.

6. An assembly in accordance with claim 4 wherein said metal comprises aluminum.

7. An assembly in accordance with claim 4 wherein said serpentine cooling tube is welded to said metal layer.

8. An assembly in accordance with claim 4 wherein said serpentine cooling tube is brazed to said metal substrate.

9. An assembly in accordance with claim 4 wherein said serpentine cooling tube is soldered to said spreader substrate.

10. An assembly in accordance with claim 1 wherein said spreader substrate is flat.

11. An assembly in accordance with claim 1 wherein said spreader substrate is cylindrical, said spreader substrate comprises a broken metal layer bonded to a thermally, said spreader substrate comprising a broken metal layer bonded to a thermally conducting, electrically non-conducting layer, said metal layer being in thermal contact with said at least one serpentine cooling tube, and said at least one serpentine cooling tube being disposed on said broken metal layer.

12. An assembly in accordance with claim 11 further comprising a thermally conductive annular fin affixed to and thermally conductive to said spreader substrate, said annular fin essentially in a plane perpendicular to an axis of the cylindrical substrate.

13. An assembly in accordance with claim 11 wherein said thermally conductive annular fin comprises a broken metal layer bonded to a thermally conducting, electrically non-conducting layer.

14. An assembly in accordance with claim 13 wherein said thermally conducting, electrically nonconducting layer is outwardly directed from the cylindrical spreader substrate.

15. An assembly in accordance with claim 1 wherein the non-magnetic, thermally conducting spreader substrate comprises a generally curved geometry.

16. An assembly in accordance with claim 15 wherein the generally curved geometry is a generally cylindrical geometry.

17. An assembly in accordance with claim 1 wherein the non-magnetic, thermally conducting spreader substrate comprises a non-flat geometry.

18. An electrical component comprising:
    a non-magnetic spreader substrate having thermally conducting surfaces;
    at least one serpentine cooling tube disposed on and in thermal contact with at least one said thermally conducting surface so that said contacted surface is cooled when said at least one serpentine cooling tube is operating; and
    a cylindrical magnetic winding layer, said magnetic winding layer in thermal contact with said non-magnetic spreader substrate so as to conduct heat from said winding layer to said non-magnetic spreader substrate;
    wherein said non-magnetic spreader substrate comprises a metal layer bonded to a thermally conducting, electrically nonconducting layer, said metal layer is in thermal contact with said at least one serpentine cooling tube, and said winding layer is in contact with said thermally conducting, electrically nonconducting layer.

19. An electrical component in accordance with claim 18 wherein said spreader substrate is cylindrical, said at least one serpentine cooling tube is inside said cylindrical spreader substrate, and said cylindrical winding layer is outside said cylindrical spreader substrate.

20. An electrical component in accordance with claim 18 wherein said spreader substrate is cylindrical, said at least one serpentine cooling tube is outside said cylindrical spreader substrate, and said cylindrical winding layer is inside said cylindrical spreader substrate.

21. An electrical component in accordance with claim 20 further comprising a thermally conductive annular fin affixed to and thermally conductive to said spreader substrate, said thermally conductive radial fin comprising a broken metal layer bonded to a thermally conducting, electrically nonconducting layer.

22. An electrical component in accordance with claim 21 wherein said thermally conducting, electrically nonconducting layer is outwardly directed from the cylindrical spreader substrate.

23. An electrical component in accordance with claim 22 further comprising a annular layer of insulation over a portion of said broken metal layer of said annular fin.

24. An electrical component in accordance with claim 23 wherein said cylindrical magnetic winding layer is a first cylindrical magnetic winding layer, and further comprising:
 a filler layer covering said cylindrical substrate and said at least one serpentine cooling tube; and
 a second cylindrical magnetic winding layer disposed over the filler layer and separated from said broken metal layer of said annular fin by said annular layer of insulation.

* * * * *